United States Patent [19]

Abraham et al.

[11] 3,909,746

[45] Sept. 30, 1975

[54] YIG-TUNED PUSH-PULL MICROWAVE DIODE OSCILLATOR

[75] Inventors: Wayne G. Abraham, Los Altos Hills; Robert T. Oyafuso, Mountain View, both of Calif.

[73] Assignee: Varian Associates, Palo Alto, Calif.

[22] Filed: June 17, 1974

[21] Appl. No.: 480,065

[52] U.S. Cl................ 331/96; 331/102; 331/107 R; 331/107 G

[51] Int. Cl.$^{2}$........................ H03B 7/14; H03B 9/12

[58] Field of Search.......... 331/96, 100, 102, 107 R, 331/107 G, 107 T

[56] References Cited

UNITED STATES PATENTS

| | | | |
|---|---|---|---|
| 3,546,624 | 12/1970 | Omori | 331/107 G |
| 3,576,503 | 4/1971 | Hanson | 331/96 |
| 3,668,552 | 6/1972 | Kuno et al. | 331/102 X |

*Primary Examiner*—Siegfried H. Grimm
*Attorney, Agent, or Firm*—Stanley Z. Cole; D. R. Pressman; R. K. Stoddard

[57] ABSTRACT

A microwave oscillator includes first and second Gunn effect diodes coupled to a YIG sphere by a loop. The Gunn effect diodes are mechanically and d.c. electrically connected to said loop on opposite sides of the sphere, which is magnetically coupled to a central portion of the loop so that there is an a.c. connection between the diodes and sphere, which a.c. connection is at least approximately push-pull. A d.c. bias connection through the loop is established in parallel to the diodes. An output loop orthogonal to the first loop is magnetically coupled to the sphere.

15 Claims, 3 Drawing Figures

YIG-TUNED PUSH-PULL MICROWAVE DIODE OSCILLATOR

FIELD OF THE INVENTION

The present invention relates generally to microwave oscillators and more particularly to a microwave oscillator employing a plurality of two-terminal negative resistance devices coupled to a high Q ferrimagnetic filter.

BACKGROUND OF THE INVENTION

Tunable microwave oscillators employing a two-terminal negative resistance, semiconductor active device capable of oscillating at microwave frequencies, e.g., Gunn effect diodes, IMPATT diodes, tunnel diodes or avalanche diodes, in combination with a tunnel high Q filter employing a ferrimagnetic body are known. The ferrimagnetic body is a crystal having molecules with magnetic moments precessed at a rate determined by a magnetic field applied thereto and is exemplified by a yttrium iron garnet (YIG) sphere. The prior art microwave oscillators have been generally characterized by including a single active device and a single crystal, as exemplified by the oscillator disclosed in U.S. Pat. No. 3,546,624 to Omori, commonly assigned with the present invention.

While the prior art devices have functioned satisfactorily for many purposes, it is frequently desirable to increase the power output thereof without altering the output impedance. Typically, the prior art devices have an output impedance on the order of 50 ohms, which matches the impedance of many driven devices in C, X and Ku bands. In other instances, it is desirable to provide a microwave oscillator that is tunable over a very wide frequency range, in excess of an octave in these three bands. One problem that has arisen with many of the prior art oscillators, whether designed for extremely wide band tuning or maximum power output, is the introduction of appreciable second harmonic energy from the oscillator to the load.

In an attempt to remedy these problems of the prior art, we have experimented with several different configurations. One configuration employed a plurality of Gunn effect diodes connected electrically in parallel to each other, and side-byside at the end of a coupling loop. It was found, however, that the parallel Gunn effect device configuration reduced the output impedance of the device approximately by one-half, with a corresponding reduction in output power.

We also considered using multiple YIG spheres to obtain greater power output. However, we found that this was not practical because of the inability to obtain YIG spheres having identical characteristics, whereby the resonant frequencies of the two YIG crystals would be dissimilar for the same magnetic field.

BRIEF DESCRIPTION OF THE INVENTION

In accordance with the present invention, an improved microwave oscillator obviating the previously set forth problems of the prior art is provided by including a pair of two-terminal negative resistance devices capable of oscillating over a band of microwave frequencies. The negative resistance devices are coupled to a ferrimagnetic body so that they are operated at least approximately in a push-pull configuration.

In one embodiment, the two-terminal devices are dimensioned alike so that they have a tendency to oscillate with the same amplitude versus frequency response over an entire band of interest. The oscillating devices are located symmetrically on either side of the ferrimagnetic body to which they are coupled by a loop having arms of equal length on opposite sides of the body. In a second embodiment, the two devices have slightly different electrical parameters, so that one of the devices has a tendency to oscillate with an amplitude versus frequency response that is shifted relative to the response of the other device. The oscillating device with the response shifted to the lower frequency band is coupled to the ferrimagnetic body by a line having a greater impedance than that of a line coupling the other device to the body. The result is achieved by asymmetrically locating the two devices relative to the ferrimagnetic body to which they are coupled by a loop having arms of unequal length. In the first embodiment, the two devices can be considered as operating in a push-pull configuration, while in the second embodiment, there is a slight deviation from the push-pull configuration. Hence, the devices, for generic purposes, are considered to be operated at least approximately in a push-pull configuration.

The symmetrical embodiment has the advantage of maximum power output and virtually complete suppression of second harmonic energy. The fundamental frequency of the symmetrical embodiment can be tuned over almost a one octave frequency band. In one device actually constructed, it was possible to obtain a flat response over a frequency band of 8.0 to 12.4 GHz with a peak power of 124 milliwatts. The asymmetrical configuration has the advantage of being tunable over a wider frequency band, at the cost of a reduction in power output and introduction of greater second harmonic energy. In one device actually built, the asymmetrical embodiment has a flat response from 5 to 13 GHz.

It is, accordingly, an object of the present invention to provide a new anad improved microwave oscillator employing two-terminal negative resistance devices and a filter including a ferrimagnetic body.

Another object of the invention is to provide a new and improved microwave oscillator including two-terminal negative resistance devices in combination with a filter including a ferrimagnetic body, wherein greater output power, without a significant reduction in output impedance, is attained.

An additional object of the invention is to provide a new and improved microwave oscillator including a two-terminal negative resistance device and a body of ferrimagnetic material wherein there is a reduction in harmonic output of the oscillator.

A further object of the invention is to provide a new and improved microwave oscillator including two-terminal negative resistance devices and a ferrimagnetic material filter wherein the device is capable of being tuned over an extremely wide bandwidth.

The above and still further objects, features and advantages of the present invention will become apparent upon consideration of the following detailed description of several specific embodiments thereof, especially when taken in conjunction with the accompanying drawing.

DETAILED DESCRIPTION OF THE DRAWING

Figure 1:
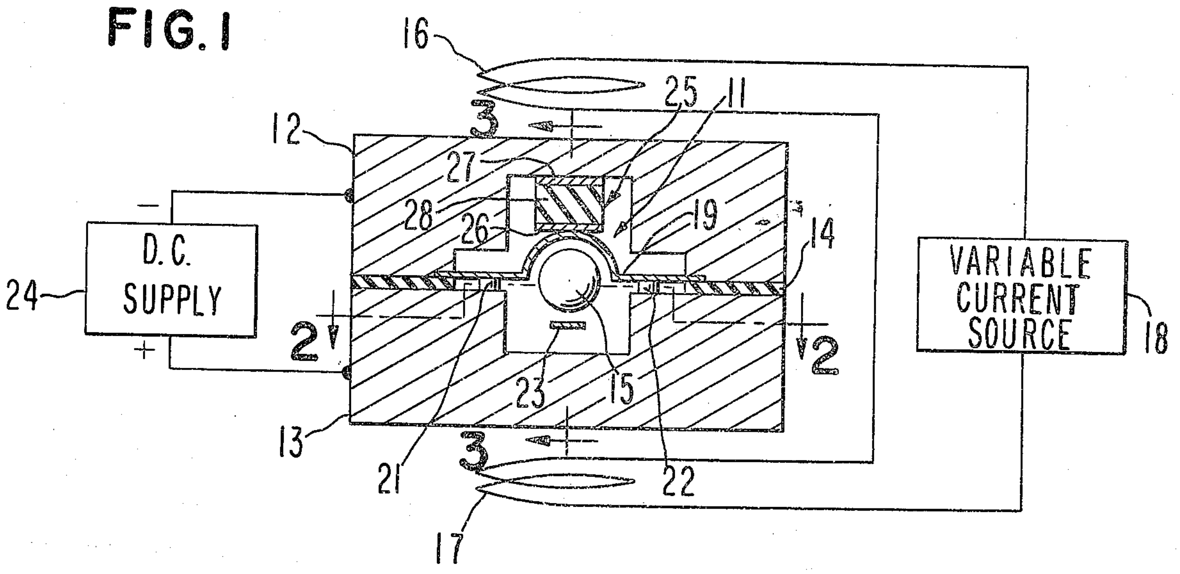
FIG. 1 is a side sectional view of a preferred embodiment of the invention.

Reference is now made to the drawing wherein a cavity 11 is illustrated as being formed in a non-magnetic metallic block having segments 12 and 13 which are spaced from each other by dielectric plate 14. The dimensions of cavity 11 are small compared to the wavelengths generated by the oscillator of the present invention in order to prevent cavity resonance modes from being generated. Thereby, the particular shape of cavity 11 is of minor importance in the operation of the oscillator.

Positioned centrally within cavity 11 is a ferrimagnetic crystal body that is preferably formed as YIG sphere 15. YIG sphere 15 is a tunable high Q (2,000 – 10,000) filter resonant to frequencies in the band generated by the oscillator. As is well known, a ferrimagnetic body is a crystal having molecules with magnetic moments precessed at a rate determined by a magnetic field applied thereto. The magnetic field is applied to YIG sphere 15 through block segments 12 and 13 by a magnetic field established by, inter alia, coils 16 and 17 which are disposed adjacent to top and bottom faces of segments 12 and 13. Coils 16 and 17 are driven by a variable current source 18, the intensity of which determines the resonant frequency of the filter formed by YIG sphere 15.

YIG sphere 15 is magnetically coupled by loop 19 to a pair of negative resistance, two-terminal microwave, semiconductor oscillating diodes 21 and 22. Diodes 21 and 22 are preferably Gunn effect diodes or IMPATT diodes, although it is to be understood that other types of two-terminal microwave oscillating devices, such as avalanche or tunnel diodes, may be employed. Gunn effect diodes 21 and 22 are biased by having d.c. parallel connections to a common d.c. source so that they function as transit time oscillators. Gunn effect diodes 21 and 22 are mechanically and electrically connected to loop 19 on opposite sides of YIG sphere 15 and are a.c. coupled to the YIG sphere so that they are operated at least approximately in a push-pull configuration. Magnetically coupled to YIG sphere 15 is an output loop 23 that extends orthogonally, i.e., at right angles, to loop 19.

In accordance with one embodiment of the invention, Gunn effect diodes 21 and 22 have substantially the same electrical parameters and thereby have substantially the same amplitude versus frequency response characteristics. Gunn effect diodes 21 and 22 are symmetrically located relative to the center of YIG sphere 15, along line 3—3, by being connected to regions on loop 19 that are of the same length from line 3—3; these regions are on arms extending in opposite directions from sphere 15. Thereby, the impedances between each of Gunn effect diodes 21 and 22 and the YIG sphere 15 are substantially the same. Because of the similarity in the amplitude versus frequency responses of Gunn effect diodes 21 and 22 and the similarity of impedance between the diodes and YIG sphere 15, the Gunn effect diodes operate in a push-pull configuration. Thereby, second and higher even harmonic currents supplied by Gunn effect diodes 21 and 22 to YIG spheres 15 are 180° out of phase, resulting in virtual elimination of the even harmonic components. Third harmonic and higher odd harmonic components are also virtually eliminated because of the high Q nature of the YIG sphere 15. The push-pull configuration of the symmetrical embodiment enables output power to be increased substantially over a single Gunn effect device, without materially lowering the driving impedance of output loop 23.

In a second embodiment, one of the Gunn effect diodes, e.g., device 21, has electrical parameters different than the other Gunn diode. Thereby, the amplitude versus frequency response of Gunn effect diode 21 is shifted from that of diode 22 so that greater energy is derived from diode 21 than from diode 22 for frequencies less than a mean oscillation frequency of the two diodes and vice versa for frequencies greater than the mean frequency. Gunn effect diode 21 is located a greater distance from the center line of YIG sphere 15 than Gunn effect diode 22. Thereby, loop 19, which is a lumped parameter, basically inductive low pass filter to the frequencies generated by diodes 21 and 22, provides a greater impedance between diode 21 and YIG sphere than between diode 22 and the YIG sphere for energy of the same frequency. Because of the tendency of diode 21 to oscillate at a lower frequency than that of diode 22 and because of the differences in impedance coupling the diodes to the YIG sphere 15, a wider band of frequencies can be derived from output loop 23 with the asymmetrical configuration than with the symmetrical configuration. The wider band results in a sacrifice of peak ouput power, as well as some additional second harmonic coupling to the ouput device. For certain applications, however, the wider band is considered more advantageous than the peak power and harmonic cancellation features.

Loops 19 and 23 are formed of non-magnetic metals, e.g., copper or aluminum, and may either be wires or relatively thin strips. Both ends of loop 19 are secured in situ between and contact the upper face of dielectric plate 14 and the lower face of block segment 12, while one end of loop 23 is embedded in and contacts faces of slot 20 in block segment 13. The connections between loop 19 and block segment 12 establish d.c. bias connections from d.c. source 24 to Gunn diodes 21 and 22 while allowing r.F. current return between loop 19 and the cavity block. The connection between loop 23 and block segment 13 provides an r.f. ground potential at the end of loop 23.

Loop 19 and block segment 12 are short circuits to d.c. currents and thereby enable a negative or ground terminal of d.c. supply 24 to be connected in d.c. circuit to one electrode of each of Gunn effect diodes 21 and 22. The electrodes of diodes 21 and 22 connected to the negative terminal of supply 24 are on the upper faces of the diodes while faces are mechanically urged against the lower face of loop 19. Bias voltage for the other electrodes of Gunn effect diodes 21 and 22 is supplied from the positive terminal of supply 24 through block segment 13, having an upper face in mechanical contact with and urged against the lower faces of negative resistance diodes 21 and 22, that form the other electrodes of the diodes. Dielectric plate 14 electrically insulates the opposite electrodes of Gunn effect diodes 21 and 22 from each other for d.c. currents.

To provide maximum magnetic r.f. coupling between loop 19 and sphere 15, the central portion of loop 19 is bent around the upper portion of sphere 15 as a semicircle that is coaxial with the center of sphere 15. To provide symmetrical coupling between loop 19 and sphere 15, the straight portions of loop 19, extending on opposite sides of sphere 15, lie in approximately the same plane as the center of the sphere.

Typically, the distance separating diodes 21 and 22 is on the order of 0.2 inches, and each of the diodes has a diameter on the order of 30 mils. The length of the loop 19 is not critical since the loop is a lumped parameter element that functions as an inductive circuit, rather than a resonant device. The loop, therefore, functions as an energy coupler between diodes 21 and 22 and the resonant device formed by YIG sphere 15.

To provide greatest r.f. current, and thereby r.f. magnetic field, in the vicinity of YIG sphere 15, by-pass capacitor 25 is provided. Capacitor 25 includes metal electrodes 26 and 27 between which is sandwiched dielectric block 28. The lower face of electrode 26 is mechanically urged against the zenith of loop 19, thereby to provide electrical connection between the loop and electrode 26 and a.c. coupling from the loop through capacitor 25 to block 12. The upper face of electrode 27 mechanically engages the roof of block 12 in cavity 11 to establish the r.f. by-pass. R.f. by-pass capacitor 25 is essentially a short circuit to r.f. currents that are coupled to the zenith of loop 19 from Gunn effect diodes 21 and 22. The placement of the capacitor thus intensifies the r.f. magnetic field through YIG sphere 15 and provides an r.f. ground at the equivalent of a transformer tap at the zenith of loop 19. There is, however, mutual inductive coupling through sphere 15 from the portions of loop 19 proximate the sphere, as well as between the portions of the loop itself to establish relative phase displacements in diodes 21 and 22 to provide the at least approximately push-pull operation.

Figure 2:
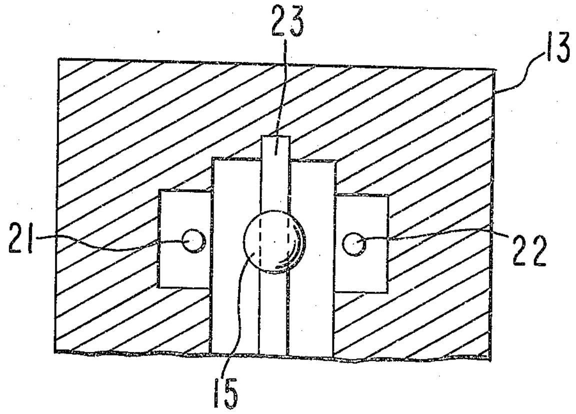
FIG. 2 is a top sectional view, taken through the line 2—2 of FIG. 1.
Figure 3:
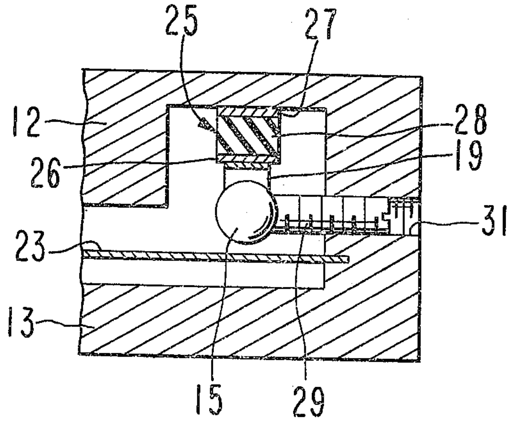
FIG. 3 is a side sectional view, at right angles to the sectional view of FIG. 1, taken through the line 3—3.

As illustrated in FIG. 3, YIG sphere 15 is positioned within cavity 11 by being bonded to one end of dielectric screw 29 that is inserted into the cavity 11 through threaded bore 31. For the purposes of clarity, the screw 29 and bore 31 are not illustrated in FIG. 2.

While there have been described and illustrated several specific embodiments of the invention, it will be clear that variations in the details of the embodiments specifically illustrated and described may be made without departing from the true spirit and scope of the invention as defined in the appended claims.

What is claimed is:

1. A microwave oscillator comprising first and second two-terminal negative resistance devices capable of oscillating over a band of microwave frequencies, a tunable high Q filter resonant to frequencies in the band, said filter including a crystal having molecules with magnetic moments precessed at a rate determined by a magnetic field applied thereto, said precession rate determining the filter resonant frequency, first means for coupling microwave energy between said devices and said crystal so that the devices are operated at least approximately in a push-pull configuration, and second means coupled to the crystal for deriving output microwave energy at the filter resonant frequency.

2. The microwave oscillator as claimed in claim 1, wherein the first device has a tendency to oscillate at a frequency lower than the second device, and the first means for coupling provides, in the band, a higher impedance between the crystal and the first device than the impedance between the crystal and the second device.

3. The microwave oscillator as claimed in claim 1, wherein the first and second devices have a tendency to oscillate at approximately the same frequency, and the means for coupling provides, in the band, approximately the same impedance between the crystal and each of the first and second devices.

4. The microwave oscillator as claimed in claim 1, wherein the first and second coupling means are respectively first and second conductive loops orthogonal to each other and magnetically coupled to the crystal.

5. The microwave oscillator of claim 4, wherein a central portion of the first loop is magnetically coupled to the crystal, said loop extending in opposite directions from the crystal, said first and second devices being respectively mechanically and electrically connected to said loop on opposite sides of the crystal, and means for establishing d.c. bias connections through the loop to the devices.

6. The microwave oscillator of claim 5, wherein the first device has a tendency to oscillate at frequencies lower than the second device, the length of the loop between the central portion and the first device being greater than the length of the loop between the central portion and the second device.

7. The microwave oscillator of claim 5 wherein the first and second devices have a tendency to oscillate at approximately the same frequencies, the length of the loop between the central portion and both the first and second devices being approximately the same.

8. The microwave oscillator of claim 5, further including an r.f. by-pass capacitor having an electrode contacting the central portion of the first loop.

9. The microwave oscillator of claim 5, wherein said central portion is bent to extend around a substantial portion of the crystal.

10. A microwave oscillator comprising first and second two-terminal transit time microwave negative resistance devices, a sphere of ferrimagnetic material, a first metal loop extending in opposite directions from the sphere, a central portion of the first loop being magnetically coupled to the sphere, said first and second devices being respectively mechanically and electrically connected to said loop on opposite sides of the sphere, means for establishing a d.c. bias connection through the loop to the devices, and a metal output loop orthogonal to the first loop and magnetically coupled to the sphere.

11. The microwave oscillator of claim 10, wherein said central portion is bent to have approximately a semicircular shape that is substantially concentric with the sphere.

12. The microwave of fo claim 11, further including an r.f. by-pass capacitor having an electrode contacting said central portion.

13. The microwave oscillator of claim 10, wherein the first device has a tendency to oscillate at frequencies lower than the second device, the length of the loop between the central portion and the first device being greater than the length of the loop between the central portion and the second device.

14. The microwave oscillator of claim 10, wherein the first and second devices have a tendency to oscillate at approximately the same frequencies, the length of the loop between the central portion and both the first and second devices being approximately the same.

15. The oscillator of claim 5 wherein the ends of said loop extend away from said crystal past said devices, said ends being electrically connected to a common conductive block.

* * * * *